United States Patent [19]
Väis/änen et al.

[11] Patent Number: 5,241,694
[45] Date of Patent: Aug. 31, 1993

[54] CIRCUIT FOR FORMING LOW POWER LEVELS IN A TRANSMITTER OF A RADIO TELEPHONE

[75] Inventors: Risto Väis/änen; Jukka Sarasmo; Vesa Pekkarinen, all of Salo, Finland

[73] Assignee: Nokia Mobile Phones Ltd., Salo, Finland

[21] Appl. No.: 512,783

[22] Filed: Apr. 20, 1990

[30] Foreign Application Priority Data

May 12, 1989 [FI] Finland .................................. 892316

[51] Int. Cl.[5] ............................................. H04B 1/04
[52] U.S. Cl. .................................... 455/126; 455/115; 330/284
[58] Field of Search ...................... 455/68, 69, 98, 115, 455/126, 127, 249.1; 330/279, 284; 375/60; 379/63

[56] References Cited

U.S. PATENT DOCUMENTS

| | | | |
|---|---|---|---|
| 3,732,496 | 5/1973 | Boyer | 455/69 |
| 4,309,771 | 1/1982 | Wilkens | 455/69 |
| 4,523,155 | 6/1985 | Walczak et al. | 330/279 |
| 4,560,949 | 12/1985 | Young | 330/284 |
| 4,754,231 | 6/1988 | Sawa | 330/279 |
| 4,803,440 | 2/1989 | Hotta et al. | 330/284 |
| 4,972,439 | 11/1990 | Kuznicki et al. | 375/60 |
| 4,992,753 | 2/1991 | Jenson et al. | 330/284 |
| 4,993,021 | 2/1991 | Nannicini et al. | 455/52 |

Primary Examiner—Reinhard J. Eisenzopf
Assistant Examiner—Edward Urban
Attorney, Agent, or Firm—Darby & Darby

[57] ABSTRACT

The present invention concerns a circuit for forming low power levels in a transmitter of a radio telephone. By a power amplifier (1) of the transmitter is formed the maximum power level and a plurality of lower power levels. As taught by the invention, very low power levels can be produced by controling the power of the RF signal leaking through the power amplifier (1) when said signal is not amplified by the power amplifier. For controlling the leakage power, a PIN diode attenuator (4) connected before the power amplifier (1) is used.

9 Claims, 1 Drawing Sheet

CIRCUIT FOR FORMING LOW POWER LEVELS IN A TRANSMITTER OF A RADIO TELEPHONE

BACKGROUND OF THE INVENTION

The present invention concerns a circuit by which, in a transmitter comprising a controlled amplifier of one or several stages, the lowest power levels can be formed and controlled with good efficiency.

In a transmitter of a radio telephone, class C type amplifiers are generally used, which amplifiers are characterized by good efficiency, 60 to 80 percent, at high power levels. Because of the great non-linearity of the class C type amplifier, difficulties arise in realizing control of the amplifier at low power levels, and in addition, when low power levels are used, the efficiency of the amplifier is reduced. This causes no harm when a system (or a locality of use) is in question in which the smallest transmission levels need not be used. The situation will be different, for instance in the digital GSM system covering all Europe and to be started at the beginning of the decade to come, in which very low power levels will be in use. If a telephone is going to be used in an airplane, it is necessary to use a low power level in order to prevent potential interference with the aviational electronics. Consequently, probably the lowest power levels, on the order of $-17$ dBm in magnitude will have to be used.

A typical principle block diagram of a transmitter for a GSM radio telephone is presented in FIG. 1. The block diagram only shows the blocks required for understanding the operation. A signal to be transmitted enters, e.g., the input RFin of a three-stage class C type power amplifier. The gain of the amplifier 1 is controlled by a reference amplifier 3, the output of which is filtered before being input to the power amplifier 1. The input signals of the reference amplifier 3 are the voltage derived from a power sensor 2, said voltage being proportional to the output voltage RFout of the power amplifier 1, and the control voltage TXC1 derived from the logic section of the telephone. Said blocks 1, 2 and 3 constitute a control loop, which tends to be controlled such that in a state the voltage to be derived from the power sensor 2 and the control voltage TXC1 derived from the logic sections of the radio telephone are of equal magnitude.

With the procedure of the prior art, power levels are obtained which extend from the maximum level down to about 25 dB below the maximum power level. If a wider power control range is wished, the following difficulties arise: the narrowness and non-linearity of the dynamic range of the power sensor and the poor controllability of a power amplifier of the class C type make the control of the low power levels difficult. On small power levels, the efficiency of the amplifier is extremely poor. According to the specifications of the GSM system, the power increase will on low power levels conform to the $COS^2$ graph and this is difficult with a class C type amplifier.

SUMMARY OF THE INVENTION

The object of the present invention is to produce a circuit with which, when using a class C type amplifier, small power levels may, nevertheless, be generated controllably and with good efficiency.

The circuit of the invention for producing low power levels is characterized in that a controllable attenuator is connected in series with the power amplifier, said attenuator not controlling a radio frequency signal (RF signal) when said signal is being amplified in the power amplifier, but with which the RF signal can be amplified or not amplified when said signal is not amplified in the power amplifier (TXC1=0).

The operation of the circuit of the invention is based on the phenomenon that although no control voltage (TXC1=0) enters the power amplifier, the RF power entering the input of the amplifier is, however, shown in the output RFout of the transmitter in the form of leakage power. The amount of said leakage power is in general of the same order of magnitude as the lowest power levels to be used in the GSM system. The quantity of said leakage power can be controlled with an attenuator and in this manner, the low power levels of the required order can be provided.

BRIEF DESCRIPTION OF THE DRAWINGS

The invention is described below more in detail, referring to the accompanying figures, in which.

DESCRIPTION OF THE PREFERRED EMBODIMENT

Figure 1:
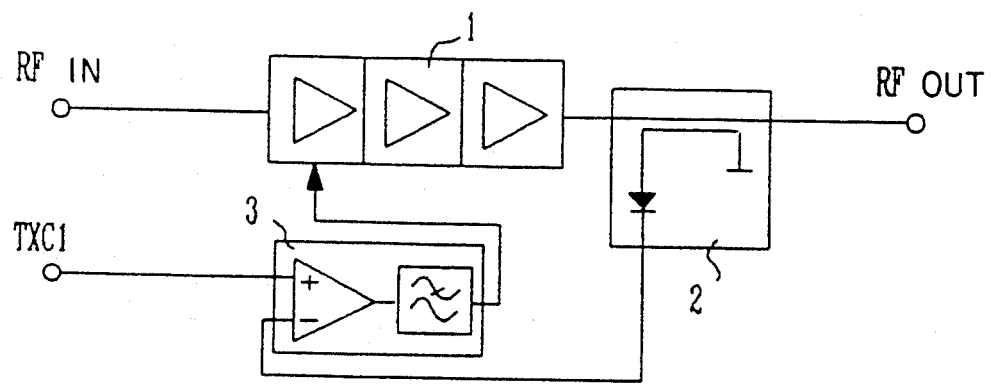
FIG. 1 presents a principle block diagram of a typical transmitter of a GSM radio telephone.
Figure 2:
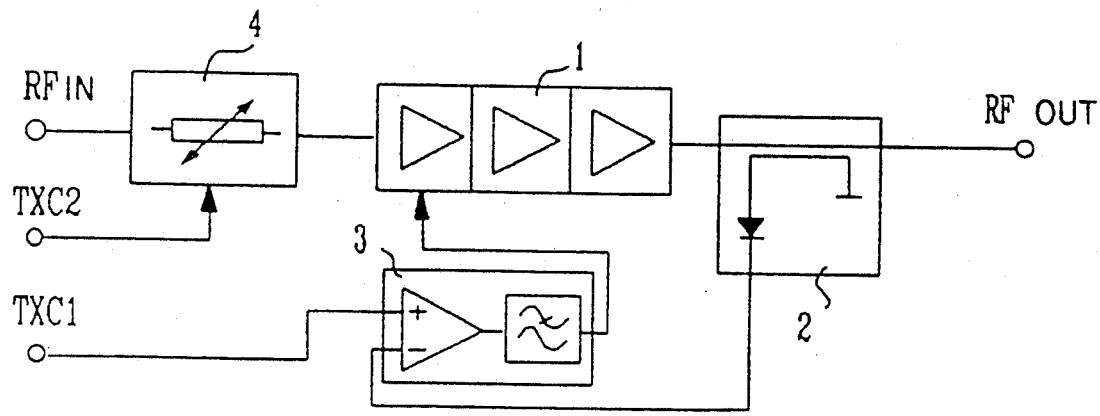
FIG. 2 presents a principle block diagram of the circuit of the invention.

FIG. 1 presents a prior art circuit, the functioning of which has already been described above. The circuit of the invention shown in FIG. 2 deviates from the circuit of FIG. 1 in that in series with the power amplifier 1 there has been coupled a controllable attenuator 4. In the present example it is connected before the power amplifier 1. The attenuator may be implemented in the form of a PIN diode attenuator controlled by a control voltage TXC2 derived from the logic section of the radio telephone.

The circuit of the invention operates as follows. When it is desired to operate a transmitter of a radio telephone at the high power levels, the bias currents of the diodes of the PIN diode attenuator 4 are so controlled with the voltage TXC2 that the attenuation is minimal, whereby the RF signal is allowed to proceed without any obstruction to the power amplifier 1. This RF signal is controlled by the voltage TXC1 derived from the control logic, and produces a transmitter output signal RFout at the desired power level. If very low transmission signal power levels are required, the gain of the power amplifier is set to be zero by setting the control voltage TXC1 to be TXC1=0. Hereby, the radio frequency signal entering the input RFin enters the PIN diode attenuator 4, where it may be attenuated, as desired, as determined by the control signal voltage TXC2. From the attenuator, the RF signal proceeds on to the power amplifier stage 1, where no control voltage is applied. The signal proceeds, however, as leakage of the RF power to the output RFout of the radio telephone transmitter. This leakage power may therefore be controlled by the PIN diode attenuator 4. The greatest transmission power level in the output RF out derived in this state is, because of losses, to some extent lower than the power of the entering RF signal in the transmitter input RFin.

In comparison with the transmitter of the GSM radio telephone known in the art, by which power levels of only about 25 dB below the maximum power level can be produced, the circuit of the invention offers a simple and inexpensive solution for forming very low power levels. Since the circuit is based on a RF signal leaking through a RF power amplifier, and on the attenuation thereof, only two lowest power levels can therefore be established in practice, their order of magnitude being about −17 dBm. The circuit of the invention for producing low power levels consumes little current, since on low power levels the power amplifier is not given control and therefore consumes no current. The dynamics of the transmitter power sensor need not cover the entire power range because on low power levels the sensor is not used at all.

In principle the attenuator may be placed also after the power amplifier. In practice, this is however more difficult and less worthwhile because in that case the attenuator must tolerate the maximum transmission power derived from the power amplifier. In addition to the PIN diode attenuator, also a voltage or current controlled amplifier stage may be used as an attenuator.

We claim:

1. A circuit for generating low power RF signals from a radio telephone transmitter, comprising:

a power amplifier of variable power gain for receiving an input RF signal from the transmitter and generating said RF signal at a selectable power level in response to a control signal applied to said power amplifier to control said gain, said power amplifier passing an RF leakage signal from its input to its output when said gain is set to zero by said control signal, said control signal being in a range of selectable magnitudes, a range of power amplifier outputs being producable from a lowest level, when said gain is zero, to a maximum power level;

a controllable attenuator in series with said power amplifier for receiving said input RF signal and attenuating it in a range from zero attenuation to a maximum attenuation in response to a selectable first control voltage applied to said attenuator, the power output of said circuit when said power amplifier gain is zero being determined by said RF leakage signal and the level of said signal attenuation by said attenuator.

2. A circuit according to claim 1, wherein the attenuator is connected before the power amplifier.

3. A circuit according to claim 1, wherein the attenuator is a PIN diode attenuator and the first control voltage (TXC2) is derived from the control logic of the radio telephone.

4. A circuit according to claim 1, said circuit being used in a transmitter of a digital radio telephone, e.g. in the GSM system.

5. A circuit according to claim 4, wherein the digital radio telephone is in a GSM system.

6. A circuit as in claim 1, wherein said attenuator first control voltage produces zero attenuation by said attenuator when said power amplifier gain exceeds zero.

7. A circuit as in claim 1, wherein said power amplifier includes at least one amplifier stage of the class C type.

8. A circuit according to claim 1, wherein said attenuator is one of a voltage and current controlled amplifier and said first control voltage is derived from a control logic circuit of a radio telephone.

9. A circuit according to claim 1, further including power sensor means for sensing the power output of the power amplifier and producing a voltage proportional thereto, and a reference comparator means with first and second inputs for producing the control voltage, a second control voltage derived from the control logic circuit of the radio telephone being applied to the first input with the voltage proportional to the power output level of the power amplifier being applied to the second input, the magnitude of said control signal applied to said power amplifier depending on the voltage difference between said first and second inputs, said second control voltage, said sensor means and said reference comparator means constituting a control loop for setting and maintaining selected levels of circuit power output.

* * * * *